United States Patent [19]
Doyle et al.

[11] Patent Number: 5,694,439
[45] Date of Patent: Dec. 2, 1997

[54] BI-DIRECTIONAL LOW PASS FILTERING METHOD AND APPARATUS

[75] Inventors: James T. Doyle; Carl F. Liepold, both of Chandler, Ariz.

[73] Assignee: Intel Corporation, Santa Clara, Calif.

[21] Appl. No.: 408,270

[22] Filed: Mar. 21, 1995

[51] Int. Cl.$^6$ .................................................. H04B 1/10
[52] U.S. Cl. ..................... 375/350; 364/724.01; 455/307
[58] Field of Search ........................... 375/343, 350; 364/724.01; 333/172; 455/296, 307

[56] References Cited

U.S. PATENT DOCUMENTS

| | | | |
|---|---|---|---|
| 4,802,234 | 1/1989 | Tatomio et al. | 333/211 |
| 4,884,036 | 11/1989 | Koyama et al. | 327/557 |
| 4,994,693 | 2/1991 | Popescu | 327/552 |
| 5,006,810 | 4/1991 | Popescu | 327/552 |

OTHER PUBLICATIONS

"Linear Phase Filter Design on a Time Domain Basis" Philobos B. IEEE pp. 836–837. 1981.

*Primary Examiner*—Temesghen Ghebretinsae
*Attorney, Agent, or Firm*—Blakely, Sokoloff, Taylor & Zafman

[57] ABSTRACT

The present invention provides a bi-directional low pass filtering method and apparatus for attenuating out-of-baseband components of data transmitted from an encoder to a decoder over a transmission medium. In one embodiment of the present invention, the bi-directional low pass filtering apparatus includes a Chebyshev filter that has a first phase response. This Chebyshev filter is coupled to a phase correction circuit, which has a second phase response. This second phase response of the phase correction circuit is designed to oppose the first phase response in order to offset variations in group delay in the data due to the Chebyshev filter.

16 Claims, 12 Drawing Sheets

BI-DIRECTIONAL LOW PASS FILTERING METHOD AND APPARATUS

BACKGROUND OF THE INVENTION

1. Field of the Invention

The present invention relates to the field of data communication, and particularly to a bi-directional low pass filtering method and apparatus.

2. Description of the Related Art

Communication networks are commonly used to interconnect a variety of computing devices. These networks typically include a number of communication nodes that transmit data from their encoders to their decoder over a variety of transmission media. One type of transmission media are twisted pair cables (such as category three unshielded twisted pair cables (UTDCAT3)), which are used by a number of communication protocols such as the Ethernet protocol and the Token Ring protocol.

Typically, the encoders of communication networks have filters for filtering out the out-of-transmission-bandwidth components of data prior to transmitting data to their decoders across the transmission media. For example, in order to comply with the Federal Communication Commission's (FCC's) Part 15B requirement, which requires transmitted data signals to be 76 dBs below 0 dBm at 30 MHz, prior art encoders of baseband communication networks have low pass filters for filtering out the data components that reside outside the 30 MHz baseband.

The decoders of communication networks also utilize filters for filtering out the out-of-transmission-bandwidth noise that is picked up during transmission. For instance, prior to decoding the received data, low pass filters of decoders of baseband communication networks filter out the out-of-baseband bandwidth noise that is picked up during transmission. If decoders do not filter out the out-of-bandwidth noise due to transmission, their demodulators might erroneously predict the value of the received data because of amplitude distortions caused by the noise.

The narrower the bandwidth of a low pass filter (i.e., the smaller of the 3 dB frequency of the low pass filter), the more attenuation the low pass filter provides for attenuating the out-of-baseband components of the transmitted data. However, there are two limitations on the width of a low pass filter's bandwidth. First, a low pass filter's bandwidth cannot be so narrow so as to attenuate the fundamental energy component of the data, because this attenuation would negatively influence the demodulator's predictions of the value of the received data. Second, as the bandwidth of the filter decreases, the occurrence of correlated jitter increases (i.e., there is an increase in phase-related abrupt spurious variations in the phase of successive received data symbol pulses with respect to the phase of a continuous decision clock), because one of the two criteria for preventing the filter from introducing jitters is to have the bandwidth frequency of the filter at twice the fundamental energy frequency (i.e., one hundred percent of excess bandwidth is one of the two criteria for having no jitter due to the filter). The second criteria for preventing the filter from introducing jitters is to have a filter with a raised cosine impulse response.

Figure 1:
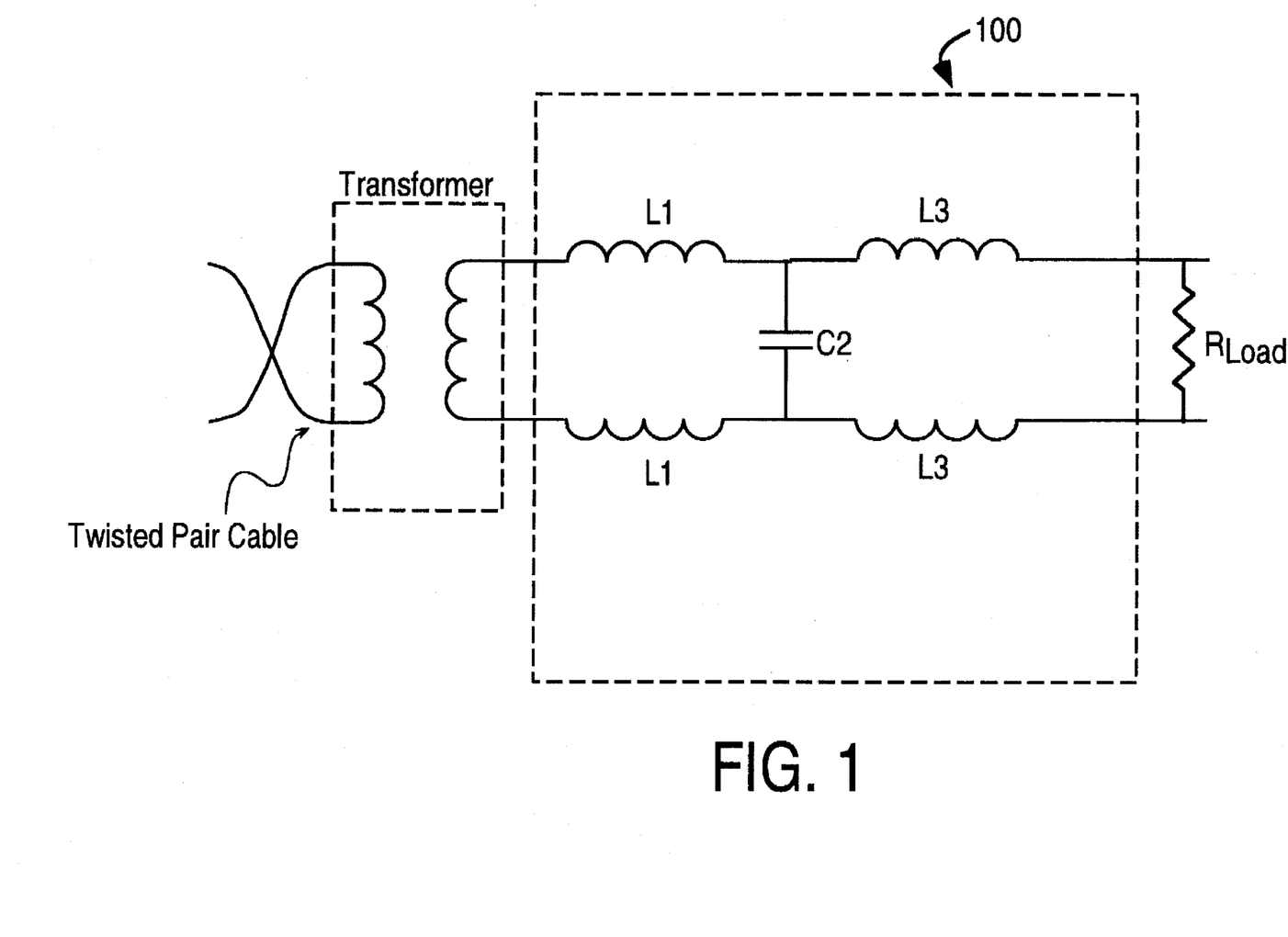
FIG. 1 presents one prior art filter used in prior art 10 MBit Ethernet data communication system.

FIG. 1 presents one prior art filter used in prior art 10 MBit Ethernet data communication systems. Filter 100 is a third order Butterworth filter which has a bandwidth of 18 MHz (i.e., the 3 dB frequency of the filter is at 18 MHz). Unfortunately, this prior art filter presents impedance matching problems because Butterworth filters do not have a relatively constant impedance over the desired low frequency range. In turn, the impedance matching problems cause this prior art filter to have poor return loss characteristics because signal reflections increase as the impedance mismatch, between the input impedance of the filter and the impedance of the source driver or the transmission medium, increases.

In addition, this third order filter does not provide sufficient attenuation for communication networks that operate at high bit rates (such as 100BaseT4T+Ethernet data communication systems). This 10 MBit Butterworth filter also does not provide sufficient attenuation for communication networks (such as the 100BaseT4T+Ethernet data communication systems) whose encoders amplify the magnitude of the transmitted data prior to transmission in order to avoid jitter. Moreover, the attenuation of this prior art filter cannot be readily improved by increasing the order of this filter, because increasing the order of this filter would result in additional unwanted characteristics. For example, increasing the order of the filter would worsen the impedance matching problems of this filter by making the impedance of this filter less predictable. The impedance of a higher ordered filter is less predictable than the impedance of a lower ordered filter, because increasing the order of a filter increases the difference between the actual transfer function of the filter and its ideal mathematical transfer function as its reactive elements are non-ideal (i.e., as its inductors have capacitances and its capacitors have inductance). In addition, increasing the order of the filter would worsen the group delay characteristics of this filter, which in turn would result in additional correlated jitter in the transmitted data.

Figure 2A:
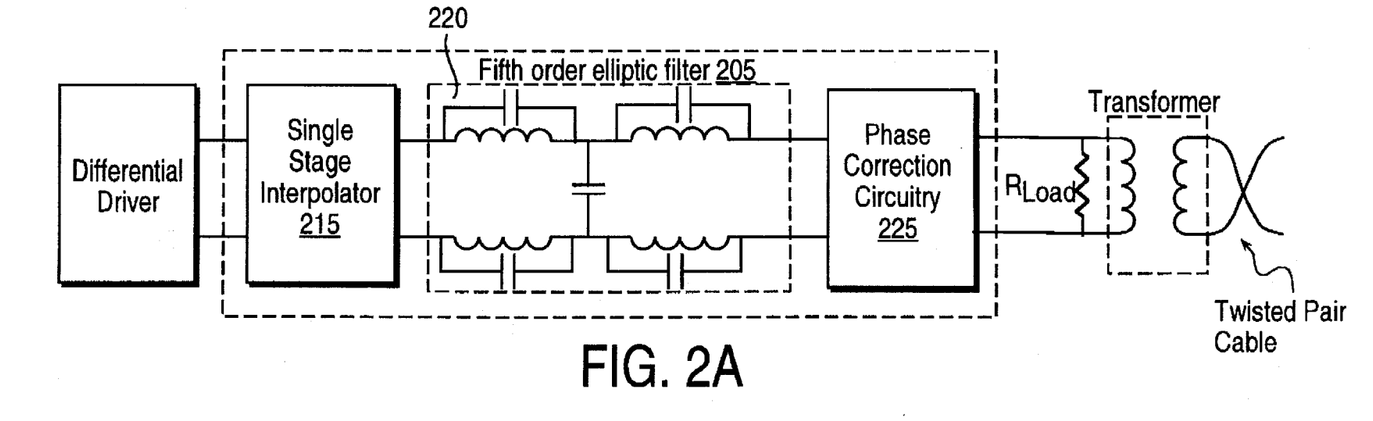
FIGS. 2A-2B present another prior art filter used in prior art 100BaseT4T+Ethernet data communication system.

FIG. 2 presents another prior art filtering apparatus. Prior art filtering apparatus 200 is used in prior art 100BaseT4T+Ethernet data communication systems. This filtering apparatus does not utilize a single bi-directional filter but rather uses transmit filter 205 for the encoding operations and receive filter 210 for the decoding operations. As shown in FIG. 2A, transmit filter 205 includes single stage interpolator 215, fifth order elliptic filter 220, and phase correction circuit 225. Single stage interpolator 215 receives the two-level digital symbol pulses from a differential driver of the encoder, in order to convert each two-level pulse into a three-level pulse. The fifth order elliptic filter then receives the output of the single stage interpolator in order to attenuate the out-of-baseband components of the data. Phase correction circuit 225 then receives this filtered data from fifth order elliptic filter 220 and adjusts the phase of the data over a frequency range of interest.

Figure 2B:
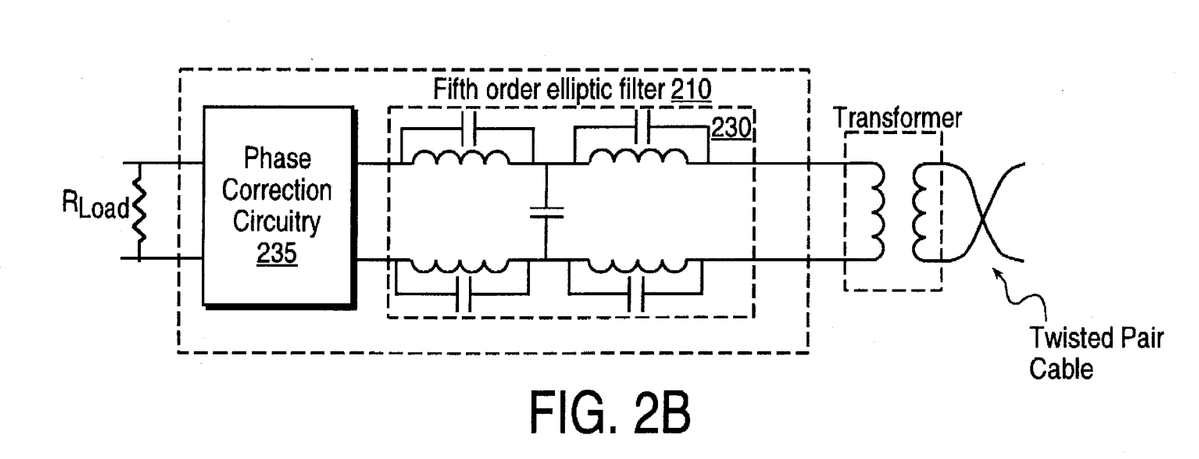

As shown in FIG. 2B, receive filter 210 also includes fifth order elliptic filter 230 and phase correction circuit 235. However, as shown in this figure, the order of the fifth order elliptic filter and the phase correction circuit in the receive filter is different from the order of the fifth order elliptic filter and the phase correction circuit in the transmit filter. This is because the fifth order elliptic does not have matched input and output impedance.

Prior art transmit filter 205 and receive filter 210 have a bandwidth of 24 MHz. Due to this wide bandwidth, these filters do not optimally attenuate the out-of-baseband components of the transmitted data. In addition, these prior art filters have spurious out-of-baseband harmonic responses (i.e., have out-of-baseband passbands), which prevent these filters from providing the optimal attenuation of the out-of-baseband components of the transmitted data. Furthermore, the return loss characteristics of these filters are poor because they do not have a constant impedance over the bandwidth of interest (i.e., over 2 to 12.5 MHz range), and thereby do not have their input impedance matched well against the impedance of source drivers or twisted pair cables. Finally, even though these filters practically have 100% of excess bandwidth, these filters introduce correlated jitters in the data, because they do not have a raised cosine impulse response.

SUMMARY OF THE INVENTION

The present invention provides a bi-directional low pass filtering method and apparatus for attenuating out-of-baseband components of data transmitted from an encoder to a decoder over a transmission medium. In one embodiment of the present invention, the bi-directional low pass filtering apparatus includes a Chebyshev filter that has a first phase response. This Chebyshev filter is coupled to a phase correction circuit, which has a second phase response. This second phase response of the phase correction circuit is designed to oppose the first phase response in order to offset variations in group delay in the data due to the Chebyshev filter.

BRIEF DESCRIPTION OF THE DRAWINGS

The objects, features, and advantages of the present invention will be apparent from the following detailed description of the present invention by reference to the following figures.

DETAILED DESCRIPTION OF THE INVENTION

The present invention provides a bi-directional low pass filtering method and apparatus for attenuating out-of-baseband components of data transmitted from an encoder to a decoder over a transmission medium. In the following description, numerous details are set forth in order to provide a thorough understanding of the present invention. However, it will be understood by one of ordinary skill in the art that these specific details are not required in order to practice the invention. In other instances, well-known electrical structures and circuits are shown in block diagram form in order not to obscure the present invention with unnecessary detail.

Figure 3:
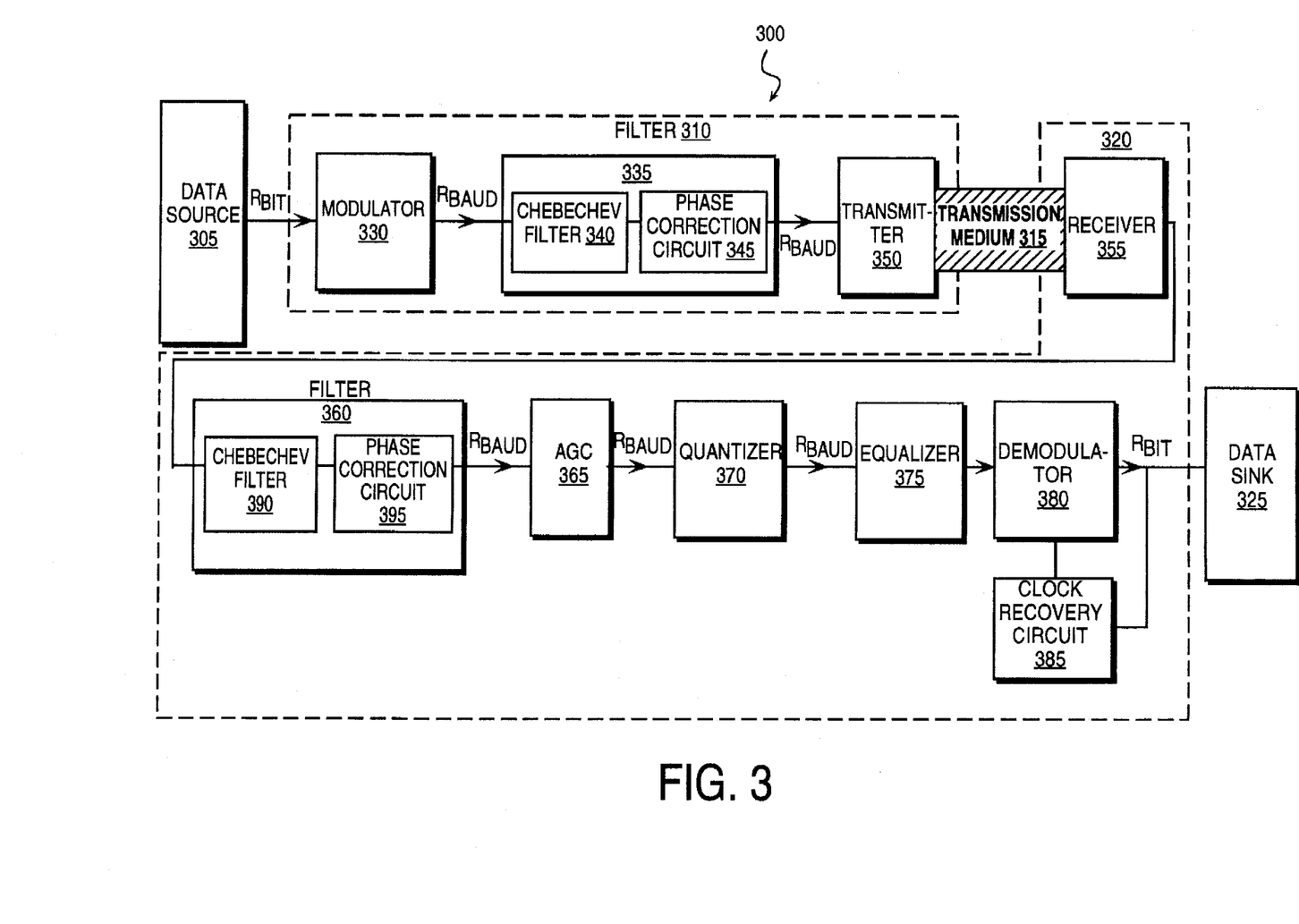
FIG. 3 presents a communication network which includes one embodiment of the bi-directional low pass filter of the present invention.

FIG. 3 presents a communication network which includes bi-directional low pass filters 335 and 360 of the present invention. Communication network 300 includes encoder 310, transmission medium 315, and decoder 320 for coupling data source 305 to data sink 325. Data source 305 supplies a data bit stream to modulator 330 at a bit transmission rate $R_{BIT}$. The modulator in turn encodes the bit stream into a plurality of data symbol pulses having a symbol transmission rate $R_{BAUD}$. Modulator 330 then supplies the modulated symbol pulses to bi-directional low pass filter 335 for filtering out out-of-baseband frequency components of the symbol pulses, which have a sinc ((sin X)/X) frequency response.

As shown in FIG. 3, one embodiment of the bi-directional low pass filter of the present invention includes Chebyshev filter 340 followed by phase correction circuit 345. A Chebyshev filter is a low pass filter which has an equiripple response in the bandwidth, and has the following transfer function:

$$|H(j\omega)|^2 = \frac{H_o}{1 + \epsilon^2 C_n^2(\omega/\omega_c)}, \quad (1)$$

where $C_n(\omega)$ is the nth order Chebyshev polynomial, $\epsilon$ is the ripple factor that determines the maxima and minima of the ripple (where $\epsilon^2 \leq 1$), $\omega_c$ is the 3 dB frequency, and $H_o$ is a constant. The Chebyshev polynomial of order n is defined by the equations:

$$C_n(\omega) = \cos(n\cos^{-1}\omega), \quad 0 \leq \omega \leq 1 \quad (2)$$
$$= \cosh(n\cosh^{-1}\omega), \quad \omega > 1. \quad (3)$$

In addition, from the 3 dB frequency ($\omega_c$), Chebyshev filters have a roll off of 6 n dB/frequency-octave.

Figure 4:
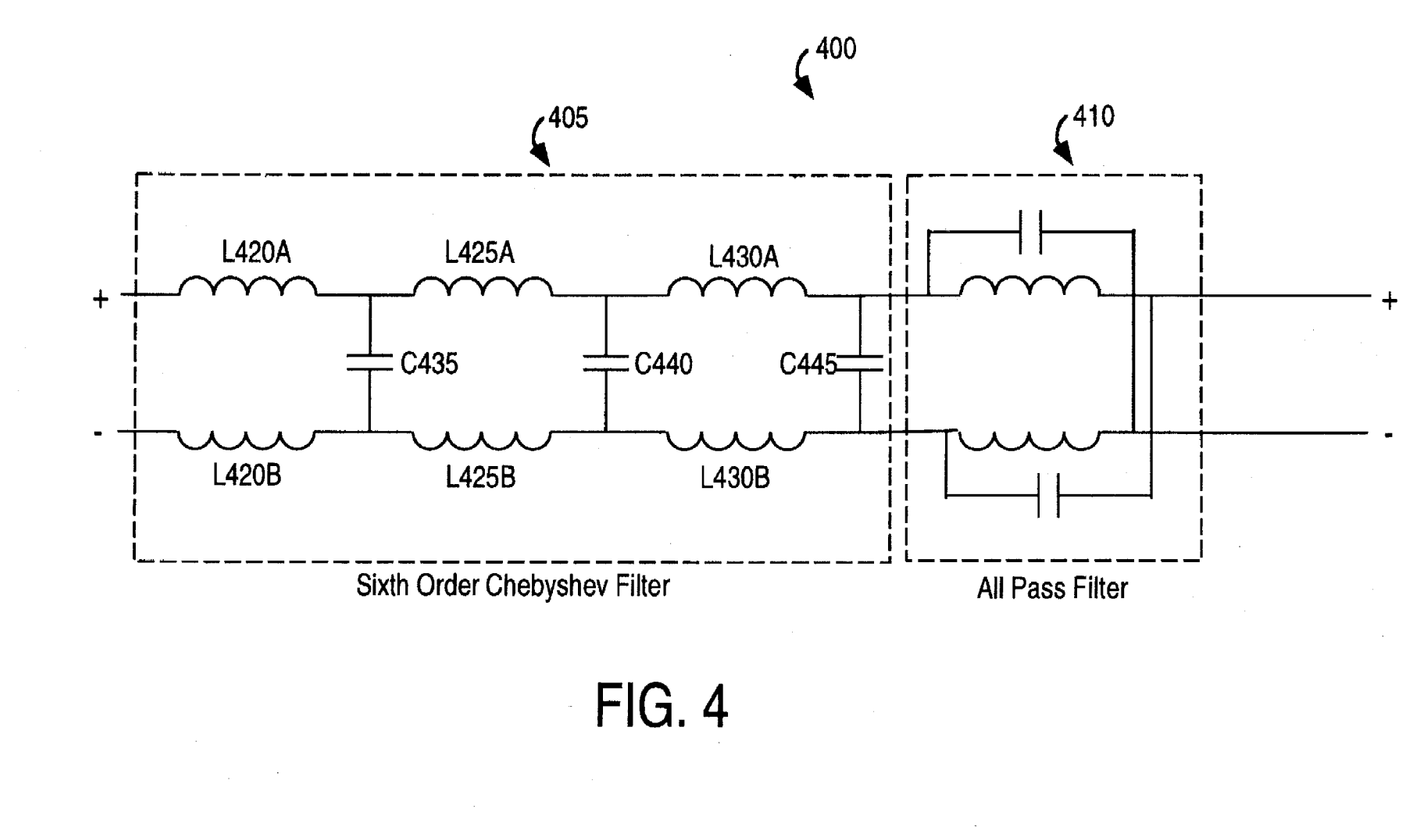
FIG. 4 presents another embodiment of the bi-directional low pass filter of the present invention.

The order of the Chebyshev filter (which is represented by variable n) is dependent on the number of reactive elements of the Chebyshev filter. For example, differential Chebyshev filter 405 of FIG. 4 is a sixth order Chebyshev filter because each end of the filter has six reactive elements (i.e., the positive side of Chebyshev filter 405 has three inductors L420A, L425A, and L430A and shares three capacitors C435, C440, C445 with its negative side, which also has three inductors L420B, L425B, and L430B). As further elaborated below, a particular number of reactive elements with particular values are used to compose Chebyshev filter 340, so that filter 335 has the desired bandwidth and provides the desired attenuation. For example, one embodiment of Chebyshev filter 340 is the sixth order Chebyshev filter of FIG. 4, which has a bandwidth of 15 MHz and which enables the transmitted data to be attenuated by 76 dBs at 30 MHz.

This embodiment of the present invention utilizes Chebyshev filter 340 because Chebyshev filters have relatively constant impedance over the FCC allotted 30 MHz baseband. In turn, this relative constant impedance of Chebyshev filters allows the impedance of bi-directional low pass filter 335 and 360 to be matched to the characteristic impedance of the transmission medium or to the impedance of the source driver. The well matched impedance of low pass filter 335 then substantially reduces signal reflections due to impedance mismatch. Furthermore, this embodiment of the present invention utilizes Chebyshev filter 340 because Chebyshev filters do not have spurious out-of-baseband harmonic responses (i.e., do not have spurious out-of-baseband passbands), which would prevent low pass filter 335 from sufficiently attenuating the out-of-baseband components of the transmitted data.

However, Chebyshev filter 340 introduces group delay effects in the data (i.e., introduces variations in the phase response of the transmitted data with respect to the frequency). In turn, variations in group delay result in correlated jitters in the data, which in turn could reduce the probability that demodulator 380 of the decoder would accurately predict the value of the received data by preventing the demodulator from sampling the received signals at the center of the symbol pulses. Consequently, Chebyshev filter 340 supplies the filtered data to phase correction circuit 345, in order to lessen the group delay variations in the data due to Chebyshev filter 340. In other words, bi-directional filter 335 includes phase correction circuit 345 in order to oppose the distortive phase effects on the data due to Chebyshev filter 340. One embodiment of phase correction circuit 345 will be further discussed below by reference to FIG. 4.

Figure 12:
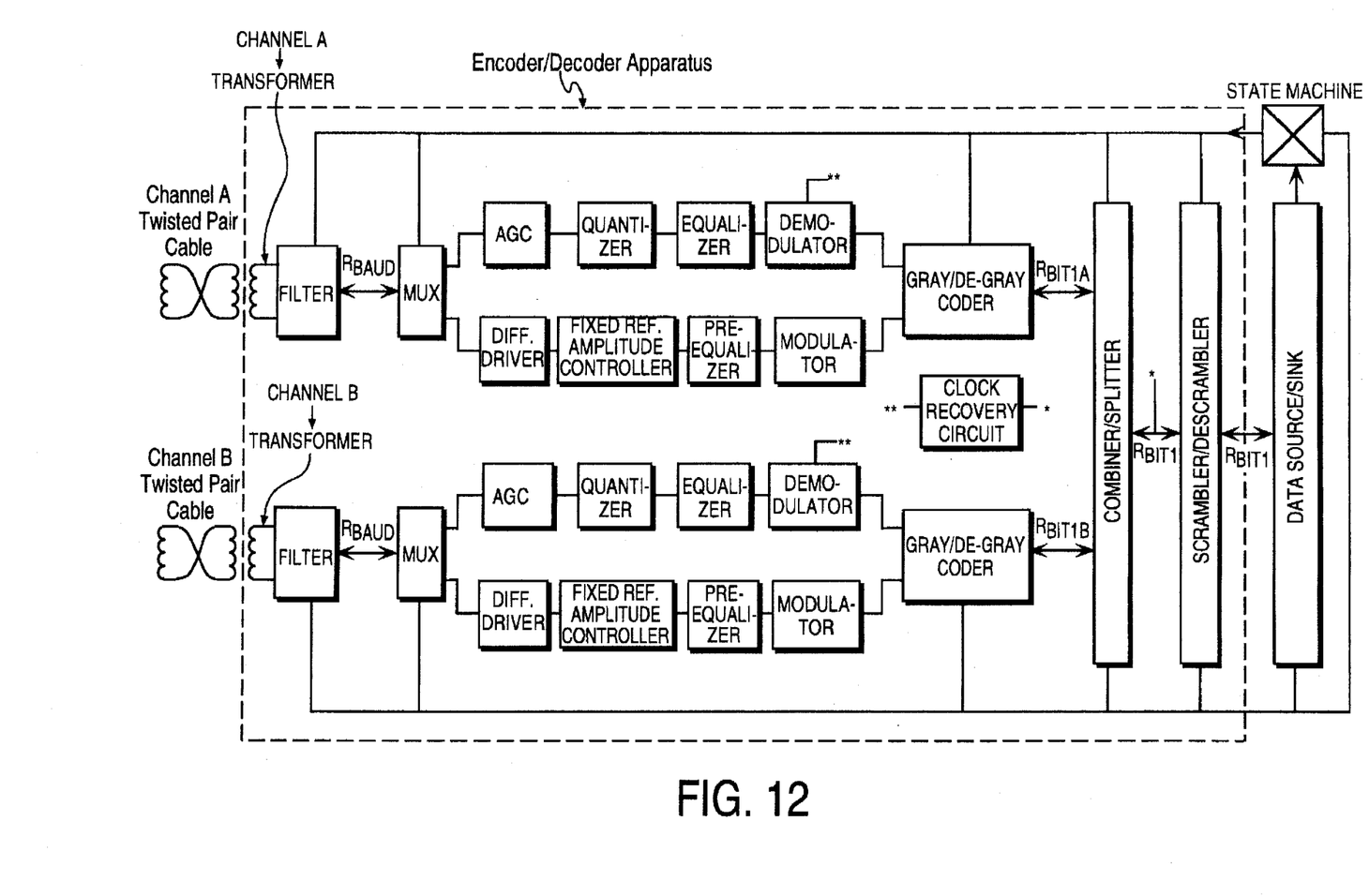
FIG. 12 presents another communication network which includes one embodiment of the bi-directional low pass filter of the present invention.

Phase correction circuit 345 in turn supplies to transmitter 350 the data that bi-directional low pass filter 335 has filtered. Transmitter 350 of encoder 310 then uses transmission medium 315 to transmit the filtered data symbol pulses to receiver 355 of decoder 320 at the symbol transmission rate $R_{BAUD}$. In turn, receiver 355 supplies the received sequence of symbols to bi-directional low pass filter 360, which filters out the out-of-baseband noise that was picked up during the transmission of the symbols. As bi-directional low pass filter 360 is identical to bi-directional low pass filter 335, the operation of filter 360 will not be discussed further in order not to obscure the description of the present invention with unnecessary detail. However, it should be noted that, because low pass filter 360 is bi-directional (since its input and output impedance are matched), the order of Chebyshev filter 390 and phase correction circuit 395 in bi-directional low pass filter 360 could be changed (i.e., phase correction circuit 395 could first receive the received symbol pulses and then supply the symbol pulses to Chebyshev filter 390). This bi-directional nature of the present invention's low pass filter is useful in communication networks (such as the communication networks set forth in FIG. 12) that have an encoder/decoder apparatus which can serve as either an encoder or a decoder.

Bi-directional modified Chebyshev filter 360 then supplies the sequence of received symbols to automatic gain control (i.e., AGC) 365. AGC 365 increases the dynamic range of the transmitted symbols by providing a coarse compensation for the attenuation due to the transmission. More specifically, since different transmission media have different characteristics which can cause different degrees of signal degradation's (e.g., different lengths of transmission cables can cause different degrees of signal degradation), decoder 320 includes AGC 365 (1) for performing an averaging function on a predetermined number of the transmitted symbols, (2) for comparing the computed average with the fixed reference signal on the AGC, and (3) for adjusting the levels of the incoming attenuated symbols to predetermined levels based on the comparison of the average with the fixed reference signal.

AGC 365 next supplies the coarsely adjusted symbols to quantizer 370, which samples the symbols at a sampling frequency equal to or greater than the Nyquist sampling frequency (e.g., samples the symbols at a sampling frequency greater than 60 MHz). Quantizer 370 then supplies the sampled symbols to equalizer 375, which in turn compensates for attenuation and group delay of the higher frequency components of the incoming symbols. The incoming symbols are then converted into digital bit pulses by demodulator 380. More specifically, demodulator 380 (1) samples the incoming symbols at a clock rate determined by clock recovery circuit 385 (which uses a well-know prior art clock recovery scheme such as a phase locked loop clock recovery scheme), and (2) compares these samples to predetermined levels in order to demodulate the incoming symbols into bit pulses. Finally, decoder 320 supplies the demodulated bit stream to data sink 325 at the bit transmission rate $R_{BIT}$.

FIG. 4 presents a more detailed embodiment of bi-directional low pass filters 335 and 360 of FIG. 3. As shown in this figure, differential low pass filter 400 includes sixth order Chebyshev filter 405 and all-pass filter 410. Chebyshev filter 405 is a sixth order LC network whose component values are selected to satisfy the Chebyshev polynomial equation (i.e., the above mentioned equations (2) and (3)). Numerous publications provide component value tables for selecting component values that satisfy a particular nth Chebyshev polynomial equation. On such reference is *The Handbook of filter Synthesis* written by Anatol I. Zverev. In addition, in alternative embodiments of bi-directional low pass filter 400, Chebyshev filter 405 has a different order. For example, in one embodiment of the present invention, Chebyshev filter 405 is a seventh order Chebyshev filter with a bandwidth of 18 MHz.

Figure 5:
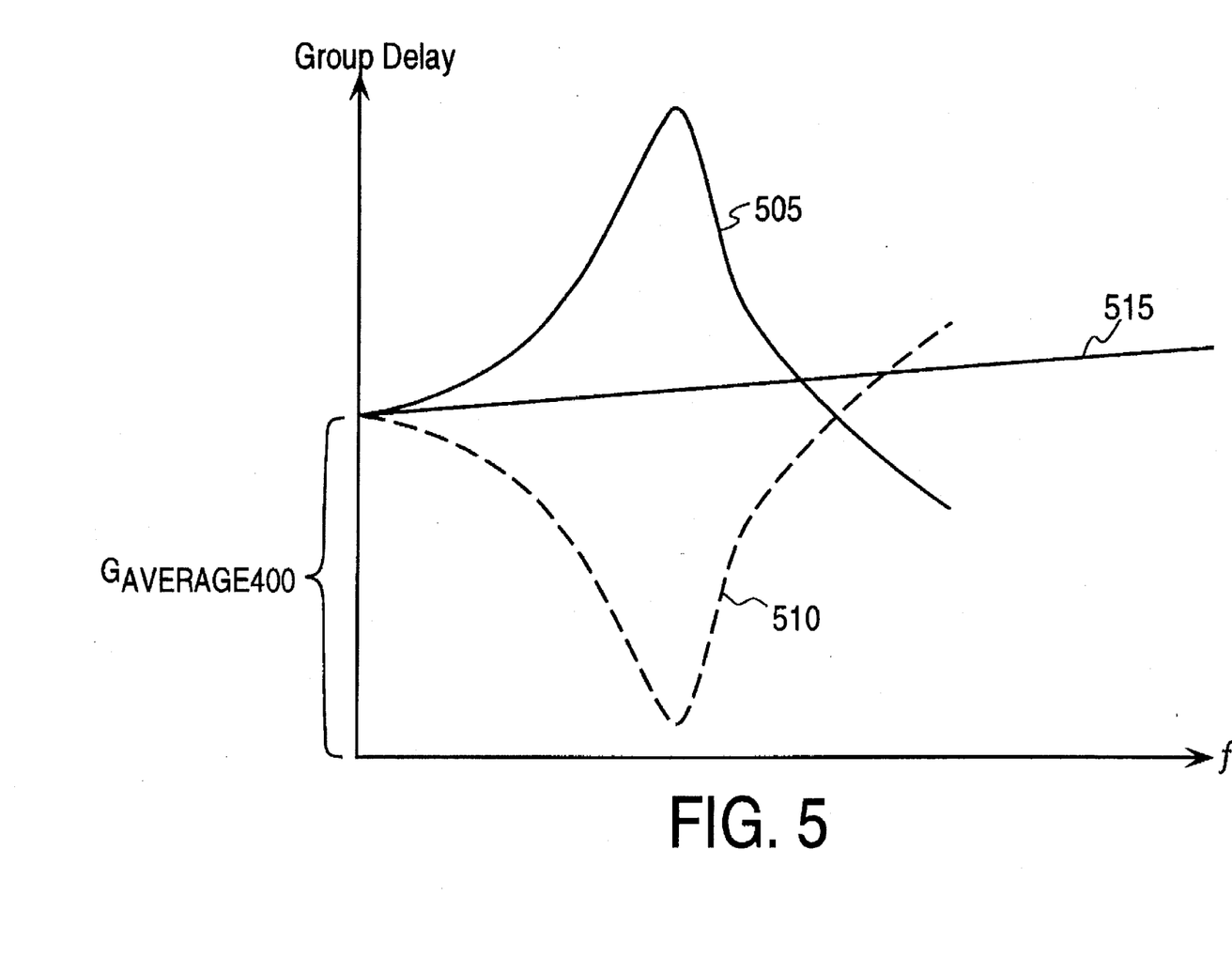
FIG. 5 presents a graphical representation of the group delay characteristics of a Chebyshev filter and a phase correction circuit of the bi-directional filter of FIG. 4, and the group delay characteristics of the bi-directional filter of FIG. 4.

As shown by curve 505 of FIG. 5, Chebyshev filter 405 introduces group delay effects in the data (i.e., introduces variations in the phase response of the transmitted data with respect to the frequency). In turn, variations in group delay result in correlated jitters in the data, which in turn could reduce the probability that the demodulator of the decoder would accurately predict the value of the received data by preventing the demodulator from sampling the received signals at the center of the symbol pulses. Consequently, bi-directional low pass filter 400 includes phase correction circuit 410, whose group delay response (shown by curve 510) opposes the group delay response of the Chebyshev filter 405 in order to reduce the group delay variations in the data due to Chebyshev filter 405. For the embodiment of the present invention set forth in FIG. 4, phase correction circuit 410 is an all-pass filter. All pass filter 410 is a cross coupled LC network, which provides phase adjustments in order to oppose the distortive phase effect on the transmitted data due to Chebyshev filter 405.

This embodiment of the present invention's bi-directional low pass filter utilizes a Chebyshev filter because Chebyshev filters have relatively constant impedance over the frequency range of interest. In turn, this relative constant impedance of Chebyshev filters allows the impedance of the bi-directional low pass filter to be matched to the characteristic impedance of the transmission medium or to the impedance of the source driver. The well-matched impedance of low pass filter 400 then substantially reduces reflections due to impedance mismatch. Furthermore, this embodiment of the bi-directional low pass filter of the present invention utilizes Chebyshev filter 405 because Chebyshev filters do not have spurious out-of-baseband harmonics responses, which would prevent this filter from sufficiently attenuating the out-of-baseband components of the transmitted data. Finally, the input and output impedance of low pass filter 400 are matched, in order to allow this filter to operate in a bi-directional manner (i.e., phase correction circuit 410 could first receive the received symbol pulses and then supply the symbol pulses to Chebyshev filter 405).

Figure 6:
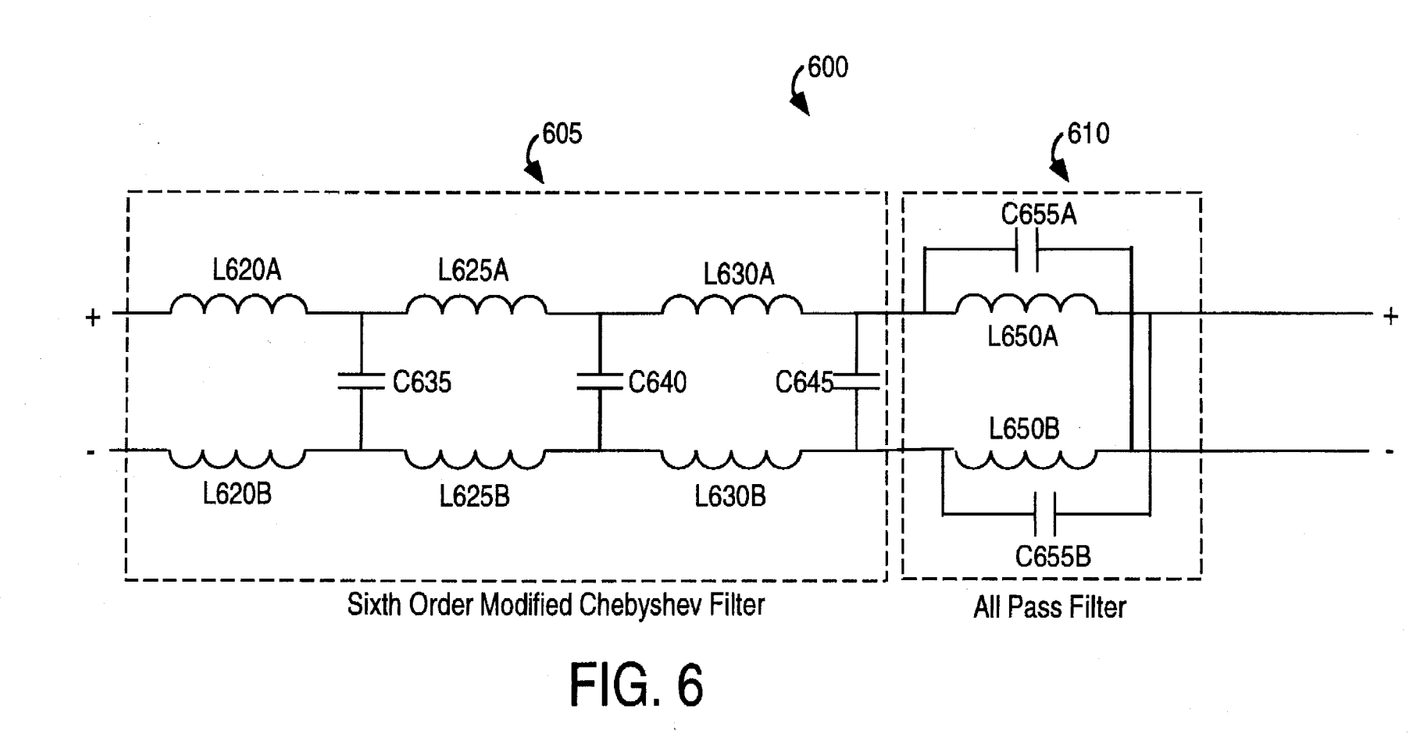
FIG. 6 presents yet another embodiment of the bi-directional low pass filter of the present invention.

FIG. 6 presents another embodiment of the low pass filter of the present invention. Like bi-directional low pass filter 400 of FIG. 4, differential bi-directional low pass filter 600 can be adapted to operate in a communication network, such as communication network 300 of FIG. 3. However, unlike bi-directional low pass filters 400, bi-directional low pass filter 600 utilizes modified Chebyshev filter 605 instead of Chebyshev filter 405. A modified Chebyshev filter is a Chebyshev filter whose reactive element values have been modified in order to further reduce variations in the low pass filter's group delay and to reduce this filter's average group delay, while maintaining a significant amount of the high attenuation and low return lost characteristics of the Chebyshev filter. In one embodiment of the present invention, modified reactive element values are selected through the use of computer simulation tools, such as Specter or Mobius Spice programs.

Figure 7:
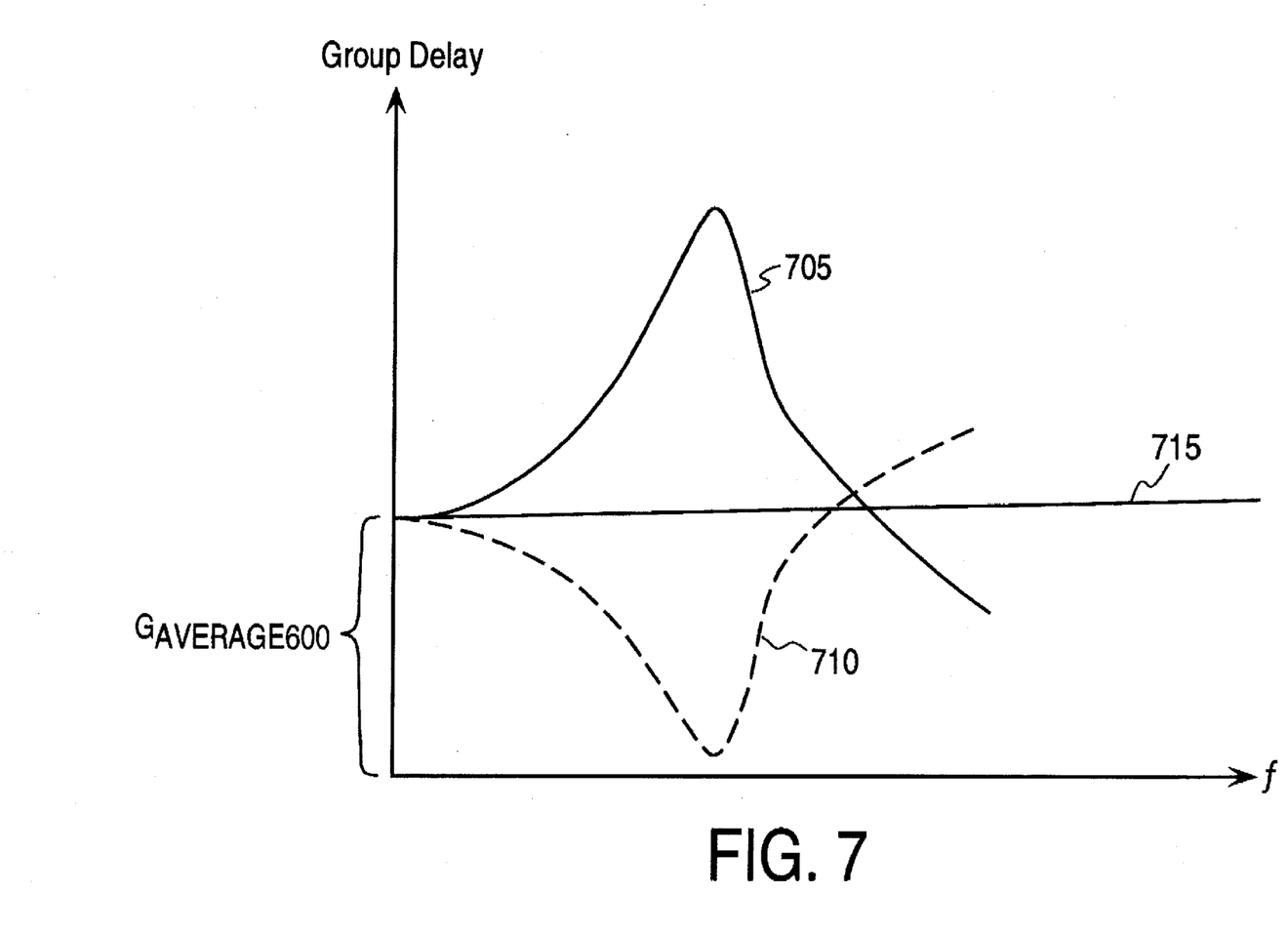
FIG. 7 presents a graphical representation of the group delay characteristics of a modified Chebyshev filter and a phase correction circuit of FIG. 6, and the group delay characteristics of the bi-directional low pass filter of FIG. 6.

Bi-directional low pass filter 600 includes phase correction circuit 610 in order to eliminate the group delay variations in the data due to modified Chebyshev filter 605 (which are shown by curve 705 of FIG. 7). For the embodiment of the present invention set forth in FIG. 6, phase correction circuit 610 is an all-pass filter. All pass filter 610 is a cross coupled LC network, whose group delay characteristics (set forth by curve 710 of FIG. 7) offset the distortive phase effects on the transmitted data due to modified Chebyshev filter 605. Consequently, as shown by curve 715 of FIG. 7, variations in group delay in the data due to bi-directional low pass filter 600 is minimized because bi-directional low pass filter 600 uses all-pass filter 610.

Moreover, as mentioned before, bi-directional low pass filter 600 utilizes modified Chebyshev filter 605 instead of Chebyshev filter 405, in order to reduce its average group delay and to further minimize variations in its group delay characteristics. For example, as shown in FIG. 5, bi-directional low pass filter 400 has a average group delay $G_{AVERAGE400}$ associated with it even after utilizing all-pass filter 410 to offset variations in group delay of Chebyshev filter 405. Consequently, in order to reduce its average group delay below the average group delay of low pass filter 400 (i.e., in order to have $G_{AVERAGE600} \leq G_{AVERAGE400}$) while maintaining a significant amount of the high attenuation and low return lost characteristics of the Chebyshev filter, bi-directional low pass filter 600 utilizes modified Chebyshev filter 605. For one embodiment of bi-directional low pass filter 600, Table 1 sets forth the reactive element values of this filter.

TABLE 1

| Reactive Element | Reactive Element Value |
|---|---|
| L620 | .383375 µH |
| L625 | .88935 µH |
| L630 | .88935 µH |
| C635 | 287.14 pf |
| C640 | 343.06 pf |
| C645 | 287.14 pf |
| L650 | .88935 µH |
| C655 | 100 pf |

As shown in FIGS. 5 and 7, the overall group delay characteristics of low pass filters 400 and 600 have slight linear slopes, which in turn translate into small amounts of linear jitter introduced by these filters. However, these amounts of jitter do not significantly influence the operation of the demodulator as they are linear in nature. Consequently, without needing 100% excess bandwidth, Chebyshev and modified Chebyshev filters of the present invention have negligible amount of jitter. Furthermore, although Chebyshev and modified Chebyshev filters do not have a raised cosine impulse response, they have equal pre-cursor and post-cursor impulse response energy peaks, which thereby allows a post-cursor energy peak of an initial (i.e., a first) pulse to be negated by the pre-cursor energy peak of a latter (i.e., a second) pulse. This cancellation in turn allows the Chebyshev and modified Chebyshev filters to have minimal inter symbol interference, without having 100% of excess bandwidth.

Moreover, low pass filter 600 has an input impedance of 150 Ohms in order to match the characteristics impedance of UTDCAT3 twisted pair cable. Finally, low pass filter 600 has matched input and output impedance, which enables it to operate in a bi-directional manner.

Figure 8:
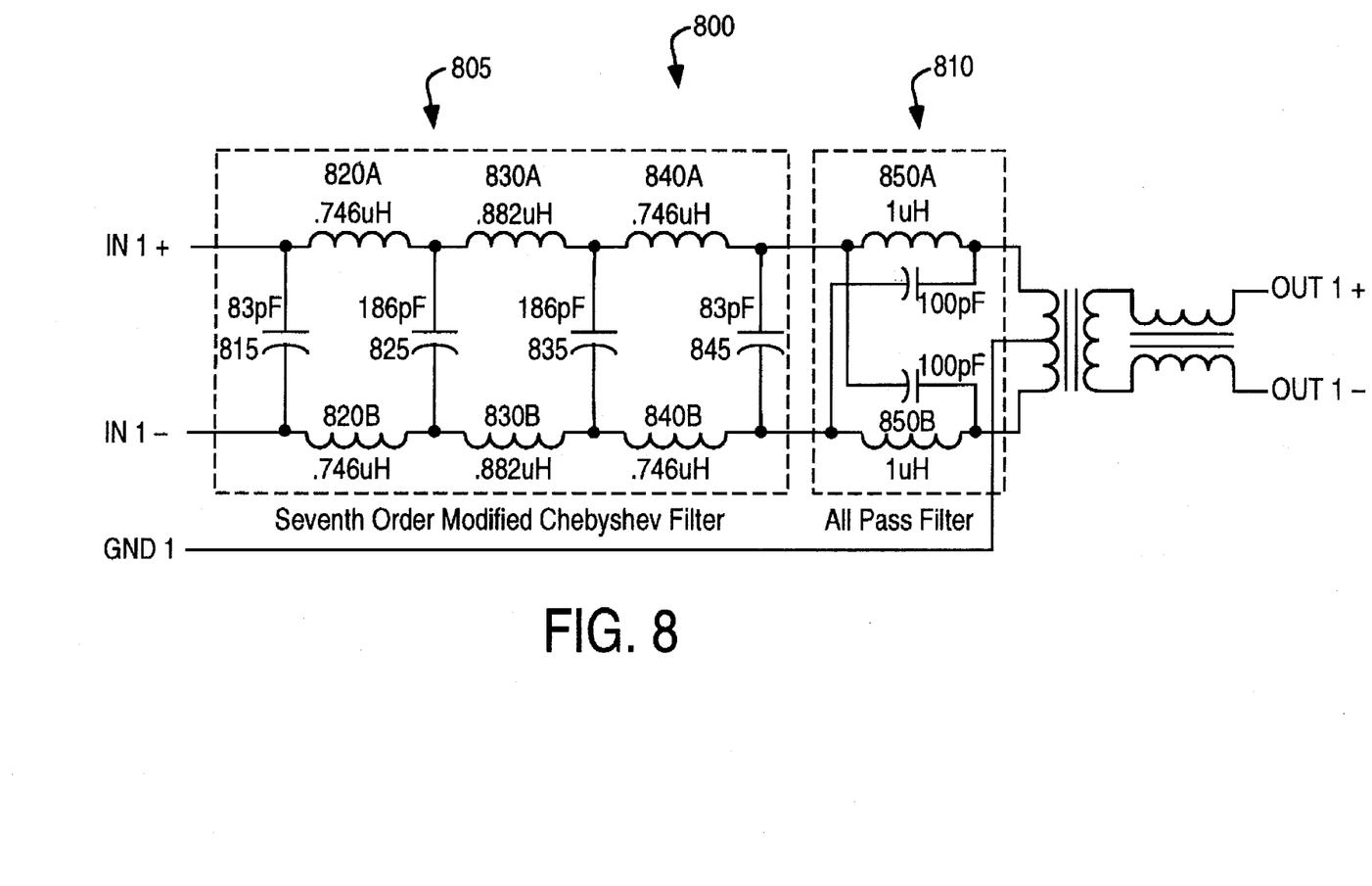
FIG. 8 presents still another embodiment of the bi-directional low pass filter of the present invention.

FIG. 8 presents yet another embodiment of the bi-directional low pass filter of the present invention. Bi-directional low pass filter 800 includes a seventh order modified Chebyshev filter 805 which is coupled to all-pass filter 810. This filter has a bandwidth of 18.6 MHz and has a return loss ratio of –22 dBs. Furthermore, over the 0 MHz to 15 MHz frequency range, this filter has an average group delay of 67.7 ns (e.g., at 5 MHz the group delay is 63.9 ns, while at 13 MHz the group delay is 72.5 MHz). The operation of low pass filter 800 is similar to the operation of low pass filter 600, and therefore will not be repeated in order not to obscure the present invention with unnecessary detail. However, it should be noted that low pass filter 800 has more parallel capacitors than shunt inductors, in order to reduce the cost of this filter.

Figure 9:
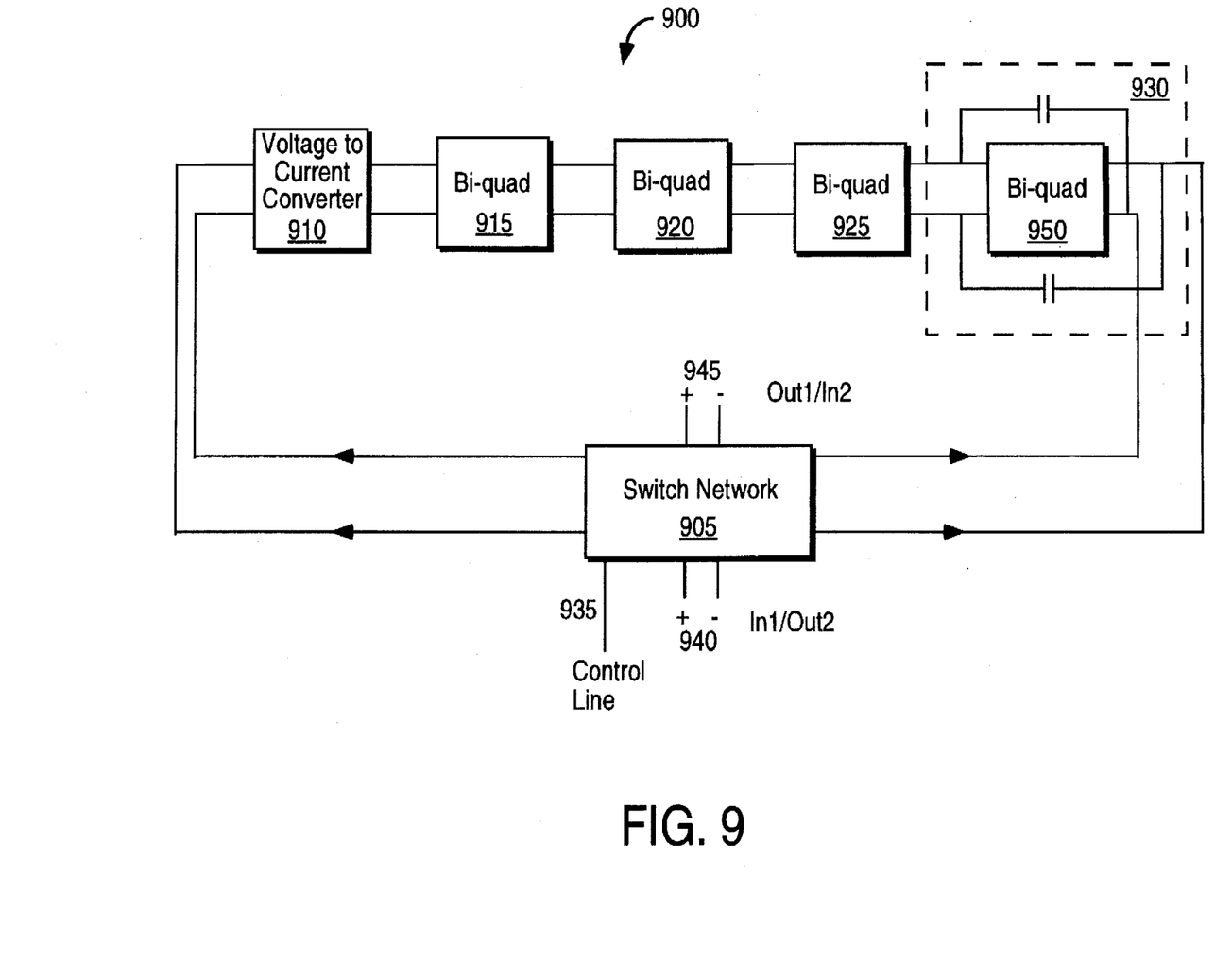
FIG. 9 presents one embodiment of an integrated circuit design for the bi-directional filter of the FIG. 8.

The bi-directional low pass filter of the present invention can not only be implemented by discrete components (as shown in FIGS. 4, 6, and 8) but also can be implemented by integrated circuits. FIG. 9 presents one embodiment of an integrated circuit design for the bi-directional low pass filter of FIG. 8. Bi-directional low pass filter 900 includes switching network 905, voltage to current converter 910, bi-quadratic filters 915, 920, and 925, and all-pass filter 930. Switching network 905 enables low pass filter 900 to operate in a bi-directional manner. In other words, depending on the value of control signal 935, switching network 905 can cause low pass filter 900 to operate as a transmit filter (i.e., to supply transmit data signals at gate 940 to converter 910 and supply filtered transmit data from all-pass filter 930 to gate 945) or to act as a receive filter (i.e., to supply received data signals at gate 945 to converter 910 and supply filtered received data from all-pass filter 930 to gate 940).

Converter 910 receives the input voltages to convert to output currents. Bi-quadratics 915, 920, and 925 then receive the data in order to attenuate the out-of-baseband data components. Bi-quadratic filters are two pole filters and replace an LC combination. For example, bi-quadratic 915 replaces inductors 820 and capacitor 815, bi-quadratic 920 replaces inductors 830 and capacitors 825, bi-quadratic 925 replaces inductors 840 and capacitors 835, and bi-quadartic 950 replaces inductors 850 and capacitor 845.

Figure 10:
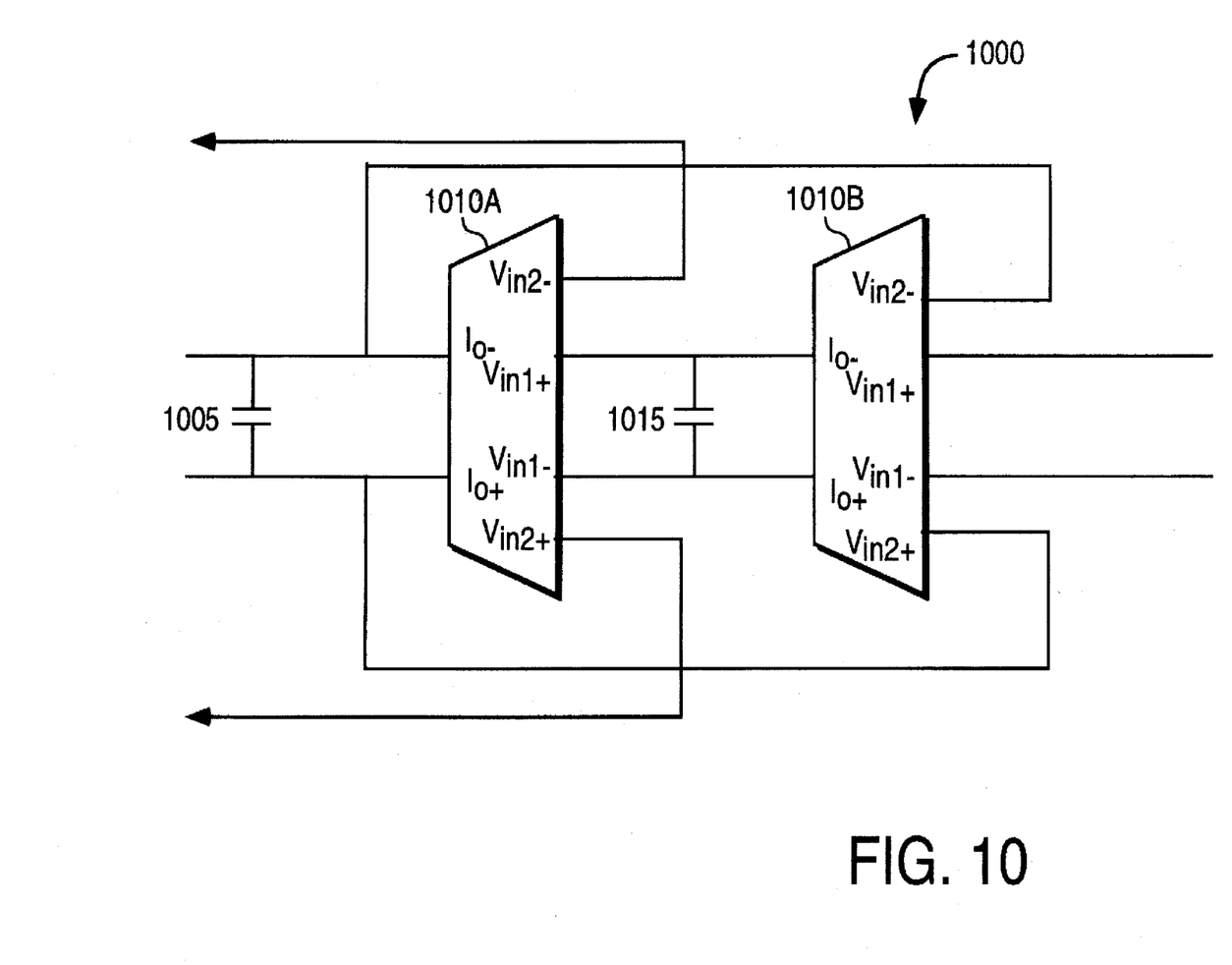
FIG. 10 presents one embodiment of a bi-quadratic filter used in bi-directional filter of FIG. 9.

FIG. 10 presents a more detailed view of one embodiment of a bi-quadratic filter which can serve as bi-quadratic filter 915, 920, or 925. As shown in this figure, bi-quadratic filter 1000 includes capacitor 1005, two dual differential amplifiers 1010, and capacitor 1015. Capacitor 1015 is identical to the capacitor of the LC network that the bi-quadratic replaces. In addition, the two dual differential amplifiers 1010 and capacitor 1015 performs the operation of the inductor of the LC network that is replaced. Consequently, $$C_{1015} = g_m^2/L \text{ with } g_m = \frac{I_{cq}}{k*T},$$

where $I_c$ is the output current of the dual differential amplifiers.

Figure 11:
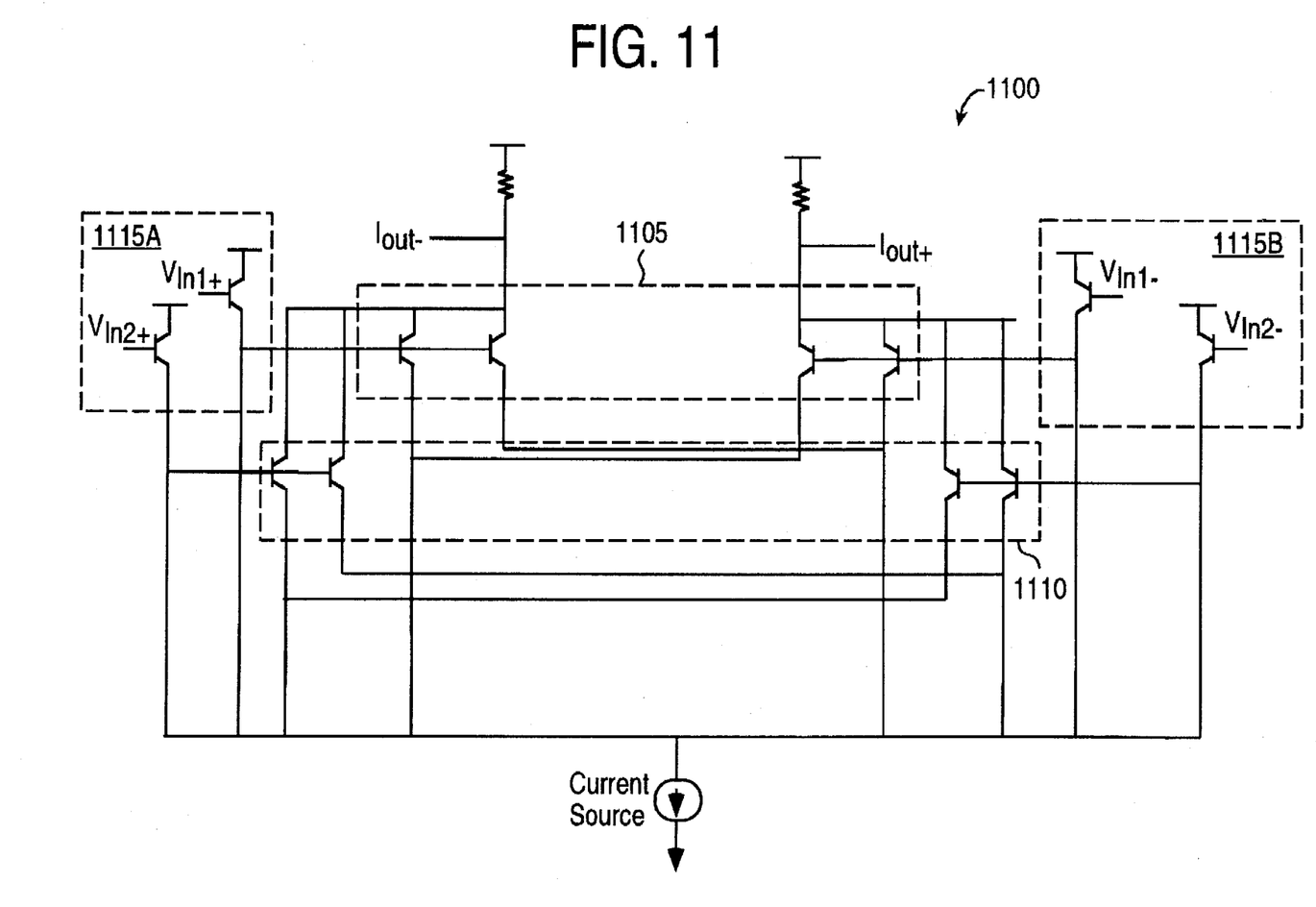
FIG. 11 presents one embodiment of a dual differential amplifier of bi-quadratic filter of FIG. 10.

FIG. 11 presents one embodiment of a dual differential amplifier of bi-quadratic 1000 of FIG. 10. As shown in this figure, dual differential amplifier 1100 includes two amplifiers 1105 and 1110 whose outputs are tied together (i.e., are driving a common loading element). In addition, these amplifiers have input voltage level shifting transistors 1115 for level shifting the input. These level shifting transistors are placed at the input of the amplifiers instead of the output of the previous amplifiers because the output of the amplifier needs to be a current (as opposed to a voltage) in order to drive a capacitor.

One of ordinary skill in the art would recognize that the above-described invention may be embodied in other specific forms without departing from the spirit or the essential characteristics of the disclosure. For instance, in alternative embodiments of the present invention, the bi-directional low pass filter of the present invention is adapted to operate with a different communication network than the one shown in FIG. 3. Thus, while certain exemplary embodiments have been described and shown in the accompanying drawings, the invention is not to be limited by the foregoing illustrative details but rather is to be defined by the appended claims.

What is claimed is:

1. An encoder for transmitting data to a decoder over a transmission medium, the encoder comprising:
   a) a modulator for encoding a data bit stream supplied by a data source into a plurality of data symbol pulses; and
   b) a bi-directional low pass filter receiving said data symbol pulses, said low pass filter for filtering out out-of-baseband frequency components of said symbol pulses, said bi-directional low pass filter including:
      a Chebyshev filter having a first phase response,
      phase correction circuit coupled to said Chebyshev filter, said phase correction circuit having a second phase response, said second phase response opposing said first phase response in order to oppose variations in group delay of said data due to said Chebyshev filter.

2. The encoder of claim 1, wherein said encoder further comprises a transmitter, said transmitter using a transmission medium to transmit data to a receiver.

3. The encoder of claim 1, wherein said modulator is coupled to said Chebyshev filter of said bi-directional low pass filter.

4. The encoder of claim 1, wherein said modulator is coupled to said phase correction circuit of said bi-directional low pass filter.

5. The encoder of claim 1, wherein said bi-directional low pass filter is implemented with discrete components.

6. The encoder of claim 1, wherein said bi-directional low pass filter is implemented with integrated circuits.

7. The encoder of claim 6, wherein said bi-directional low pass filter comprises:
   a switching network, said switching network enabling said bi-directional low pass filter to operate in a bi-directional manner;
   a voltage-to-current converter;
   a plurality of bi-quadratic filters, said bi-quadratic filters attenuating out-of-baseband data components,
   an all pass filter.

8. The encoder of claim 7, wherein said plurality of bi-quadratic filters are two pole filters.

9. An encoder for transmitting data to a decoder over a transmission medium, said encoder comprising:
   a) a modulator for encoding a data bit stream supplied by a data source into a plurality of data symbol pulses; and
   b) a bi-directional low pass filter receiving said data symbol pulses, said low pass filter for filtering out out-of-baseband frequency components of said symbol pulses, said bi-directional low pass filter including:
      a modified Chebyshev filter having a first phase response,
      phase correction circuit coupled to said modified Chebyshev filter, said phase correction circuit having a second phase response, said second phase response opposing said first phase response in order to oppose variations in group delay of said data due to said modified Chebyshev filter.

10. The encoder of claim 9, wherein said encoder further comprises a transmitter, said transmitter using a transmission medium to transmit data to a receiver.

11. The encoder of claim 9, wherein said modulator is coupled to said Chebyshev filter of said bi-directional low pass filter.

12. The encoder of claim 9, wherein said modulator is coupled to said phase correction circuit of said bi-directional low pass filter.

13. The encoder of claim 9, wherein said bi-directional low pass filter is implemented with discrete components.

14. The encoder of claim 9, wherein said bi-directional low pass filter is implemented with integrated circuits.

15. The encoder of claim 14, wherein said bi-directional low pass filter comprises:
   a switching network, said switching network enabling said bi-directional low pass filter to operate in a bi-directional manner;
   a voltage-to-current converter;
   a plurality of bi-quadratic filters, said bi-quadratic filters attenuating out-of-baseband data components,
   an all pass filter.

16. The encoder of claim 15, wherein said plurality of bi-quadratic filters are two pole filters.

* * * * *